(12) United States Patent
Tsai et al.

(10) Patent No.: US 10,361,112 B2
(45) Date of Patent: Jul. 23, 2019

(54) HIGH ASPECT RATIO GAP FILL

(71) Applicant: Taiwan Semiconductor Manufacturing Co., Ltd., Hsinchu (TW)

(72) Inventors: Wan-Lin Tsai, Hsinchu (TW); Shing-Chyang Pan, Hsinchu County (TW); Sung-En Lin, Hsinchu County (TW); Tze-Liang Lee, Hsinchu (TW); Jung-Hau Shiu, New Taipei (TW); Jen Hung Wang, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 4 days.

(21) Appl. No.: 15/725,996

(22) Filed: Oct. 5, 2017

(65) Prior Publication Data

US 2019/0006227 A1    Jan. 3, 2019

Related U.S. Application Data

(60) Provisional application No. 62/526,801, filed on Jun. 29, 2017.

(51) Int. Cl.
| | |
|---|---|
| H01L 29/66 | (2006.01) |
| H01L 29/49 | (2006.01) |
| H01L 21/8234 | (2006.01) |
| H01L 27/088 | (2006.01) |
| H01L 21/768 | (2006.01) |
| H01L 21/762 | (2006.01) |
| H01L 21/02 | (2006.01) |

(52) U.S. Cl.
CPC .. *H01L 21/76224* (2013.01); *H01L 21/02019* (2013.01); *H01L 2221/101* (2013.01)

(58) Field of Classification Search
CPC . H01L 21/845; H01L 29/785; H01L 27/1211; H01L 21/31111; H01L 29/66795; H01L 29/66545; H01L 27/0924; H01L 29/42376; H01L 29/0653; H01L 27/0886; H01L 29/7851; H01L 21/823821; H01L 29/6653; H01L 21/823842
See application file for complete search history.

(56) References Cited

U.S. PATENT DOCUMENTS

| | | | | |
|---|---|---|---|---|
| 2006/0125108 A1* | 6/2006 | Gutsche | ............... | H01L 45/06 257/774 |
| 2009/0075490 A1* | 3/2009 | Dussarrat | .......... | H01L 21/02164 438/787 |
| 2009/0269682 A1* | 10/2009 | Nishimura | .......... | H01L 21/0337 430/5 |

(Continued)

*Primary Examiner* — Brian Turner
(74) *Attorney, Agent, or Firm* — Sterne, Kessler, Goldstein & Fox P.L.L.C.

(57) ABSTRACT

The present disclosure describes a method of forming a dielectric layer or a dielectric stack on a photoresist layer while minimizing or avoiding damage to the photoresist. In addition, the dielectric layer or dielectric stack can till high-aspect ratio openings and can be removed with etching. The dielectric layer or dielectric stack can be deposited with a conformal, low-temperature chemical vapor deposition process or a conformal, low-temperature atomic layer deposition process that utilizes a number of precursors and plasmas or reactant gases.

20 Claims, 7 Drawing Sheets

(56) References Cited

U.S. PATENT DOCUMENTS

| | | | |
|---|---|---|---|
| 2010/0327410 A1* | 12/2010 | Park | H01L 27/10852 |
| | | | 257/534 |
| 2011/0212620 A1* | 9/2011 | Liang | H01L 21/02164 |
| | | | 438/692 |
| 2014/0170853 A1* | 6/2014 | Shamma | H01L 21/02115 |
| | | | 438/699 |
| 2014/0239393 A1* | 8/2014 | Kuo | H01L 29/785 |
| | | | 257/347 |
| 2015/0040077 A1* | 2/2015 | Ho | G03F 7/70433 |
| | | | 716/51 |
| 2016/0097590 A1* | 4/2016 | Sirard | H01L 21/67034 |
| | | | 34/418 |
| 2016/0372324 A1* | 12/2016 | Kao | H01L 21/02186 |

* cited by examiner

HIGH ASPECT RATIO GAP FILL

CROSS-REFERENCE TO RELATED APPLICATION

This application claims the benefit of U.S. Provisional Patent Application No. 62/526,801, titled "High aspect ratio gap fill," which was filed on Jun. 29, 2017 and is incorporated herein by reference in its entirety.

BACKGROUND

Spin-on dielectrics have particular gap-fill properties for high aspect ratio structures (e.g., at least 10:1). However, the etch rate of spin-on dielectrics may be low for high volume manufacturing. In addition, spin-on dielectrics may develop undesirable air-pockets (voids) during the spin-on process.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1:
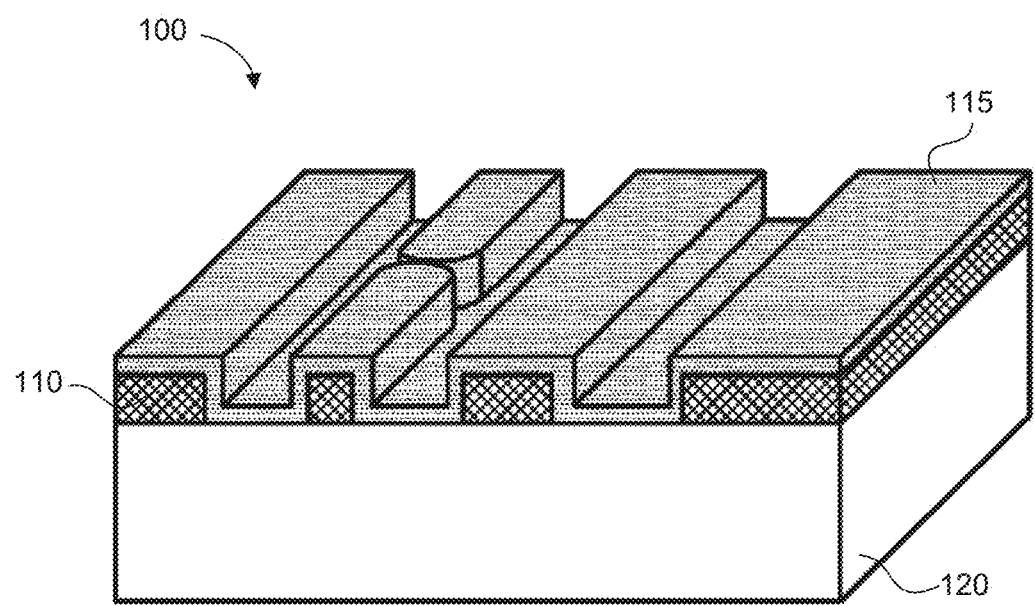
FIG. 1 is an isometric view of a spacer material over a plurality of patterned structures formed on a substrate according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances. Unless defined otherwise, all technical and scientific terms used herein have the same meanings as commonly understood by one of ordinary skill in the art to which this disclosure belongs.

Some semiconductor fabrication operations require deposition of a dielectric layer in high aspect ratio photoresist structures, e.g., at least 10:1. However, since the dielectric layer can be deposited directly on the photoresist, a low-temperature process (e.g., below 300° C.) is required to avoid damage to the photoresist. A damaged photoresist can suffer from pattern distortion such as, for example, shrinkage, unintentionally large features, line edge roughness, and thickness non-uniformity. Spin-on dielectrics (SODs) can be used to mitigate these pattern distortions. However, SODs have several weaknesses. For example they exhibit low etch rates, which can be an issue for high volume manufacturing. Additionally, SODs may develop undesirable and random air-pockets (air gaps or voids) during the spin-on process. The random voids can be a reliability concern during subsequent processing and are therefore undesirable.

To address the above shortcomings in dielectric layer deposition, embodiments described herein are directed to dielectric films, or dielectric stacks, that can be deposited with a low-temperature, conformal deposition process. The dielectric films can be deposited with oxygen-free reactants if the underlying material (e.g., photoresist) is sensitive to oxygen damage. As such, these dielectric films provide improved gap fill characteristics that can fill high-aspect ratio structures (e.g., greater than 20:1). Also, these dielectric films can be deposited directly on a photoresist layer with minimal or no damage to the photoresist material. As a result, the deposited dielectric films have improved etch rates with minimal or no voids.

FIG. 1 is an isometric view of an exemplary structure 100 according to some embodiments. Exemplary structure 100 includes patterned structures 110 on a substrate 120. Patterned structures 110 can be made of silicon (e.g., amorphous or crystalline), a dielectric (e.g., nitride, oxide, or carbide), a metal, or any combination thereof. In some embodiments, patterned structures 110 may be covered by a blanket spacer material 115. Blanket spacer material 115 can be, for example, a titanium oxide ($TiO_x$) film. In some embodiments, substrate 120 can be a partially fabricated wafer that includes front end of the line (FEOL) layers, middle of the line (MOO layers, and/or a portion of a back end of the line (BEOL) interconnect layer where metal vertical interconnect access lines (via) and parallel lines are formed. In some embodiments, substrate 120 can be a bare semiconductor bulk wafer, a top layer of a semiconductor on insulator (SOI) wafer, or a partially fabricated semiconductor wafer that includes previously formed layers (FEOL, MOL, and/or BEOL). By way of example and not limitation, substrate 120 can be made of silicon, another elementary semiconductor, an alloy semiconductor, or a combination of thereof. In some embodiments, substrate 120 can be a non-semiconducting substrate such as, for example, quartz.

Figure 2:
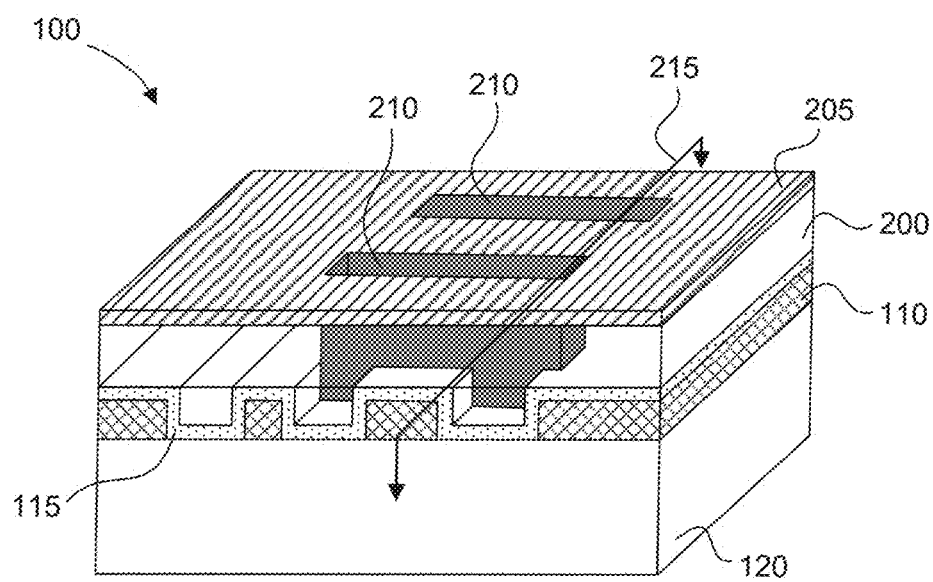
FIG. 2 is an isometric view of a photoresist layer over a spacer material with openings in the photoresist layer according to some embodiments.

FIG. 2 is an isometric view of exemplary structure 100 with a layer 200 deposited on spacer material 115 and high aspect ratio openings 210 (e.g., greater than 10:1) in layer 200 according to some embodiments. In some embodiments, layer 200 can be a photoresist layer, a dielectric layer, a metal layer, or a semiconductor layer. For example purposes, layer 200 will be described in the context of a photoresist layer. Other material layers with high aspect ratio openings can be used such as, for example, dielectrics, metals, and semiconductors. These other types of material layers are within the spirit and scope of this disclosure.

In FIG. 2, photoresist layer 200 is spin coated over patterned structures 110. The spin coating process can involve four steps: (i) dispense, (ii) spin-up, (iii) spin-off, and (iv) solvent evaporation. During the dispense step, the resist is dispensed on the wafer while the water is stationary or spinning. In the spin-up step, the wafer can be spun to spread the resist over the wafer surface. During the spin-off step, excess photoresist material is removed to obtain a uniform or near uniform resist film over the wafer surface. Finally, during the solvent evaporation step, the wafer continues to spin until the solvent from the photoresist evaporates and the photoresist film is nearly dry. After the photoresist application, the wafer is subjected to an annealing step (also known as a "soft bake" or a "pre-bake"). A purpose of the pre-bake anneal is to remove any remaining solvent from the coated photoresist, improve the adhesion of the photoresist, and relieve the stress of the photoresist that occurred during the spin coating process.

Photoresist layer 200 is a compound that undergoes a change in solubility in a developer solution when exposed to an ultraviolet (UV) or extreme ultraviolet (EUV) light. A purpose of the photoresist layer 200 in semiconductor fabrication is to assist with a mask pattern transfer to the wafer and to therefore protect portions of the underlying material during subsequent processes (e.g., an etch or an ion implantation). Photoresist layer 200 can be for example an organic compound that is sensitive to an oxygen process. For example, photoresist layer 200 cannot be subjected to oxygen-based plasma processing or oxygen thermal processing. Specifically, oxygen exposure can cause deformation of the photoresist's pattern such as, for example, shrinkage, unintentionally large features, line-edge roughness (lines with poor edge definition), and/or thickness loss.

In some embodiments, photoresist layer 200 can have a thickness between 100 and 300 nm. In some embodiments, photoresist layer 200 can be covered by a hard mask layer 205 with a thickness range between about 20 to about 40 nm. In some embodiments, hard mask layer 205 can be a layer that contains silicon, oxygen, and/or carbon. The aforementioned thickness range is merely an example and is not intended to be limiting. Photoresist layer 200 can be patterned according to a prescribed design layout so that openings 210 can be formed to expose at least one of the patterned structures 110 and part of substrate 120.

For example, photoresist layer 200 can be patterned by exposing different areas of the photoresist to UV or EUV light according to the pattern in a photomask (reticle). A post exposure bake can be applied to initiate a chemical reaction in photoresist layer 200. The chemical reaction can change the solubility of the exposed areas of photoresist layer 200. For a negative-tone photoresist, exposed areas are cross-linked (hardened) and become non-soluble in a developer solution. For a positive-tone photoresist, the non-exposed areas are crosslinked (hardened) and become non-soluble in a developer solution. In other words, for a negative tone photoresist, the exposed areas are not removed. And for a positive-tone resist, the exposed areas are removed. However, positive-tone photoresist can be used in submicron semiconductor fabrication due to its improved line width resolution.

After the photoresist exposure operation, photoresist layer 200 is developed. During the develop step, photoresist layer 200 is exposed to a developer solution that dissolves the non-crosslinked areas in photoresist layer 200. Depending on the photoresist type (i.e., negative-tone or positive-tone), non-soluble areas in photoresist layer 200 could be exposed or non-exposed areas. After the develop step, the wafer is rinsed with de-ionized water (DI) and dried. A post-development thermal bake (also known as a "hard bake") is performed to evaporate any residual solvent and to harden photoresist layer 200. Nominal hard bake temperatures for positive-tone and negative-tone resists can be about 130° C. and 150° C., respectively.

According to some embodiments, an opening 210 formed in patterned photoresist layer 200 may expose a portion of blanket spacer material 115 over one or more patterned structures 110 and a portion of blanket spacer material 115 over of substrate 120. In some embodiments, a plurality of openings similar to opening 210 can be formed across photoresist layer 200. In some embodiments, opening 210 can have an aspect ratio of about 10:1. The aspect ratio is defined as the ratio between the opening's depth to width. For example, opening 210 can have a depth of about 150 nm and bottom width of about 15 nm. In some embodiments, opening 210 can have an aspect ratio greater than about 20:1.

Figure 3:
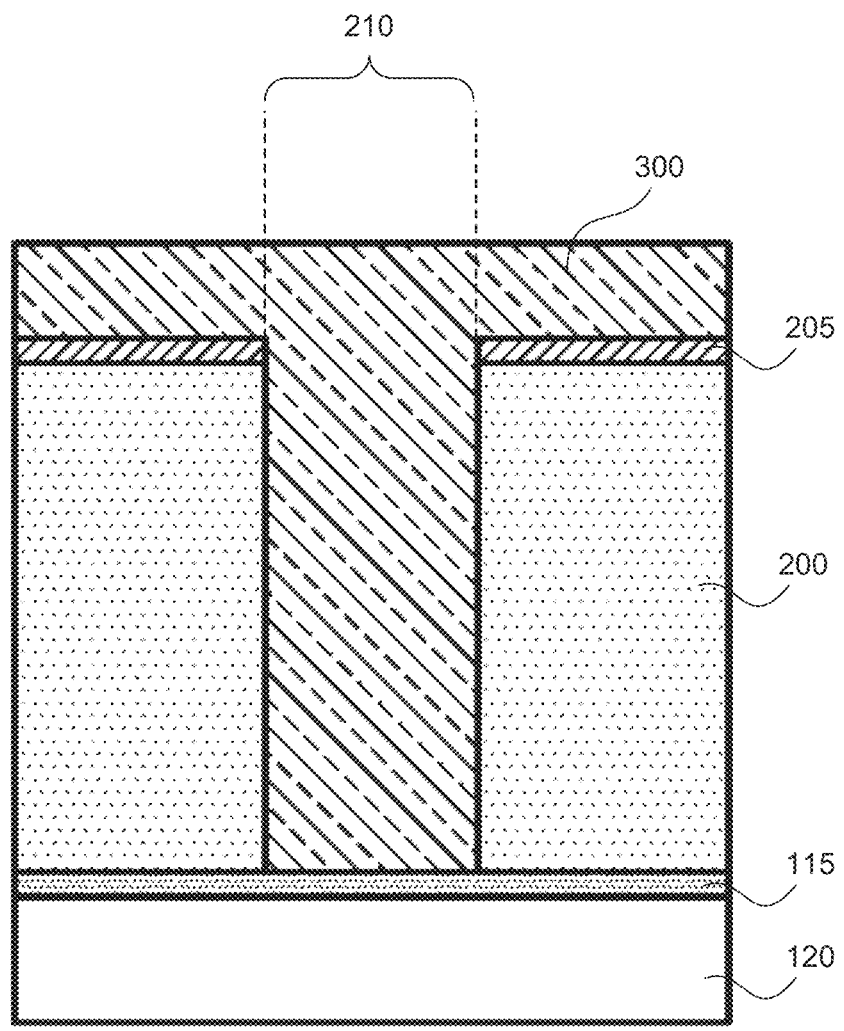
FIG. 3 is a cross-sectional view of a gap-fill dielectric material in a photoresist opening according to some embodiments.

FIG. 3 is a cross sectional view along line 215 of FIG. 2. In some embodiments, a dielectric layer 300 can be deposited over photoresist layer 200 and hard mask layer 205 to fill opening 210. In some embodiments, dielectric layer 300 can be deposited with a low-temperature plasma-enhanced atomic layer deposition (PEALD) process or a plasma-enhanced chemical vapor deposition (PECVD) process. PEALD and PECVD processes can be conformal and hence dielectric layer 300 can be deposited with minimal or no voids in structures with vertical sidewalk and not re-entrant top openings. In some embodiments, the process temperature during deposition can be below 300° C., the process pressure can range from 0.5 to 30 Torr, and the radio frequency (RF) power can range from 5 to 1000 Watts. By way of example and not limitation, at higher RF power settings dielectric layer 300 can become more dense and more etch resistant and can exhibit a lower growth rate.

During deposition (e.g., by PECVD or PEALD), the plasma can be either direct or indirect (remote) depending on a plasma rector configuration. In a direct plasma configuration, the wafer is exposed directly to a plasma discharge where reactive species have high energies. In a remote plasma configuration, the wafer is not in the direct path of the most energetic active species of the plasma and therefore the water is subjected to species that have lower energies. Remote plasmas can be used for materials that may be sensitive to some or all of the components in the plasma.

In some embodiments, dielectric layer 300 fills opening 210 and covers photoresist layer 200 and hard mask layer 205. By way of example and not limitation, the thickness of dielectric layer 300 can be up to about 500 nm.

In some embodiments, a precursor for dielectric layer 300 can be tris(dimethylamino)silane (3DMAS), tetrakis(dimethylamnino)titanium (TDMAT), bis(tertiary-butyl-amino) silane (BTBAS), or bis(diethylamino)silane (BDEAS). In some embodiments, an argon plasma, a nitrogen plasma, or a nitrogen-based plasma (e.g. ammonia ($NH_3$)) can be used during the deposition process to dissociate the precursor. In some embodiments, an oxygen plasma or a carbon dioxide plasma can be used during the deposition process to dissociate the precursor if layer 200 is not a photoresist layer or an oxygen-sensitive layer. The plasma-enhanced processes can have lower deposition temperatures (lower thermal budget) when compared to their thermal counterparts (e.g., processes that use only thermal energy for the precursor dissociation) because the plasma can provide additional "energy" necessary for the precursor dissociation. As a result, a similar thermal process may have to operate at a higher temperature if the same reactants are used. For example, a thermal process may operate at deposition temperatures of about 300° C. or more.

Figure 4:
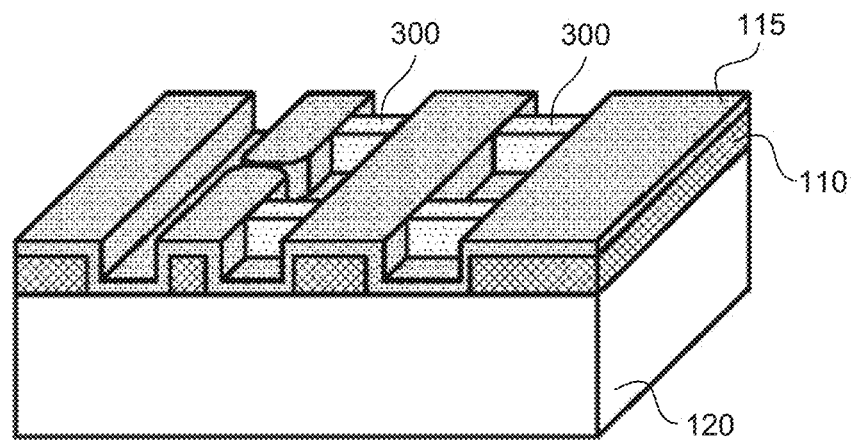
FIG. 4 is an isometric view of a gap-fill dielectric material over a spacer material after a first etch-back process according to some embodiments.

In some embodiments, dielectric layer 300, photoresist layer 200, and hard mask layer 205, which are all above spacer material 115, can be removed with an etch-back process. The etch-back process can use an etching chemistry that exhibits the same selectivity for dielectric layer 300, photoresist layer 200, and hard mask layer 205. In other words, dielectric layer 300, photoresist layer 200, and hard mask 205 need to be etched at the same rate during the etch-back process. In some embodiments, the etch-back process has a physical and chemical etch component. By way of example and not limitation, the etch chemistry can include gases such as tetrafluoromethane ($CF_4$) or trifluorotnethane ($CHF_3$) and an inert gas like Ar. In some embodiments, the etch rate for dielectric layer 300 can be in the range from about 5 Å/sec to about 50 Å/sec (e.g., 15 Å/sec) depending on etch-back process conditions and dielectric layer's 300 elemental concentration. In some embodiments, the etch-back process can stop on spacer material 115 (e.g., when spacer material 115 is exposed by the etch chemistry). Any remaining photoresist on spacer material 115 and between patterned structures 110 can be stripped (removed) with a wet clean or a dry etch process that is selective to photoresist layer 200. FIG. 4 shows patterned structures 110 and spacer material 115 after the completion of an etch-back process and wet clean or dry etch operation according to some embodiments.

Figure 5:
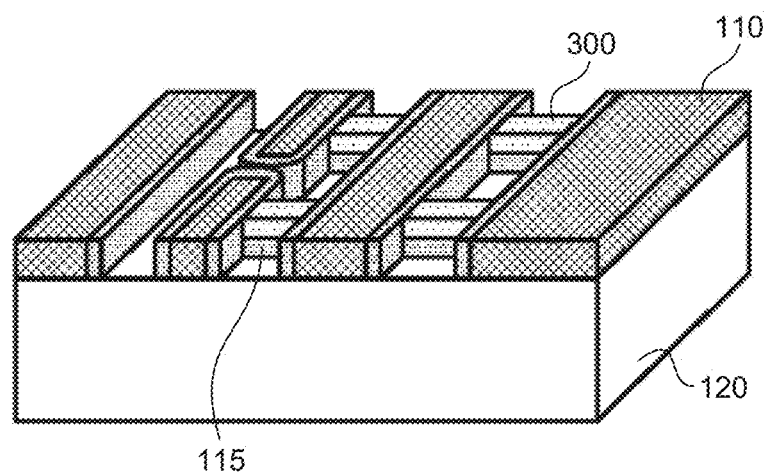
FIG. 5 is an isometric view of a gap-fill dielectric material over a spacer material after a second etch-back process according to some embodiments.

In some embodiments, a second etch-back process may remove spacer material 115 from horizontal surfaces until a top surface of the patterned structures 110 and a top surface of substrate 120 are exposed. In some embodiments, spacer material 115 is not etched on vertical surfaces of patterned structures 100, as shown in FIG. 5.

In some embodiments, dielectric layer 300 can be a stack that includes two or more layers. By way of example and not limitation, a dielectric stack layer can include: (i) a thin bottom layer (e.g., up to about 6 nm) deposited over photoresist layer 200 and hard mask layer 205 and conformally covers the exposed surfaces inside the photoresist opening(s); and (ii) a thicker top layer (e.g., up to about 500 nm) deposited over the bottom layer to fill the opening(s) in photoresist layer 200. In some embodiments, the top layer is considered a gap-fill layer.

Figure 6:
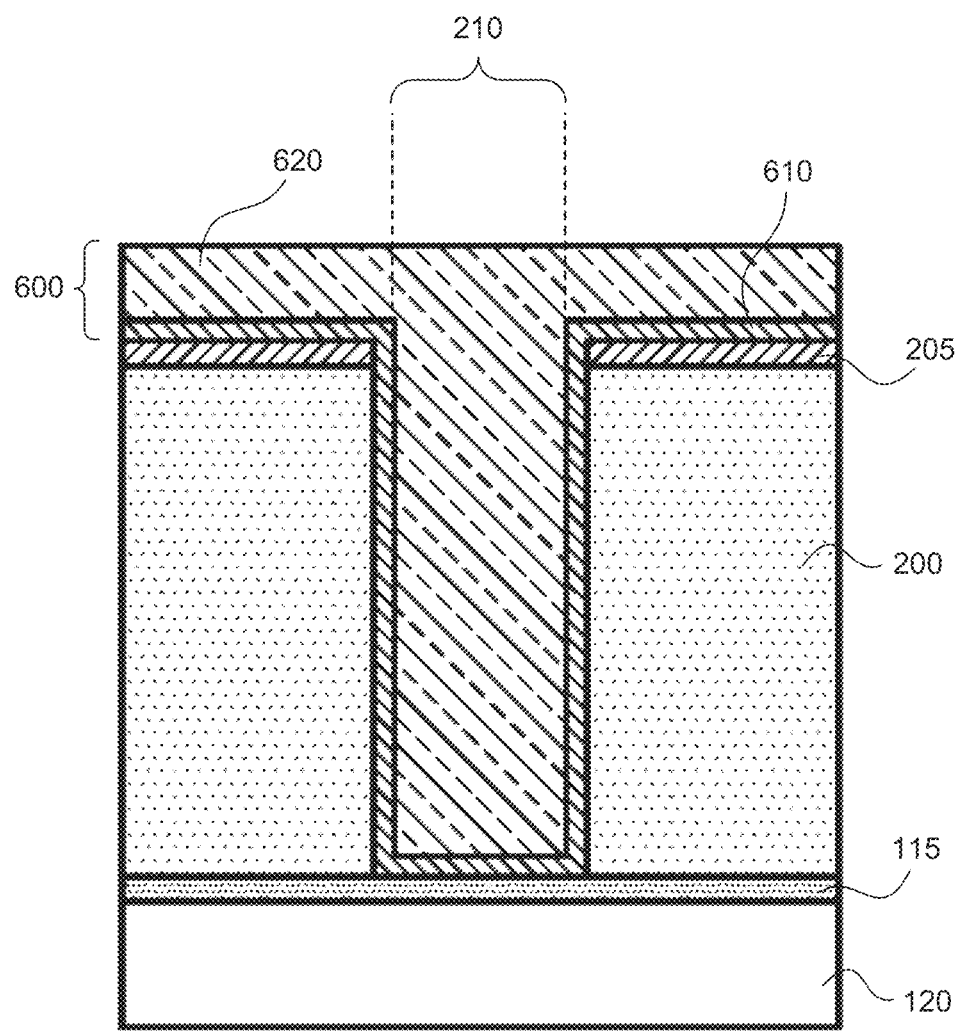
FIG. 6 is a cross-sectional view of a dielectric stack in a photoresist opening according to some embodiments.

FIG. 6 shows a stack configuration of a dielectric stack layer 600. Dielectric layer 610 is a bottom layer of dielectric stack layer 600, and dielectric layer 620 is a top (or gap-fill) layer of dielectric stack layer 600. In some embodiments, dielectric layer 610 can provide protection against photoresist damage if the deposition of dielectric layer 620 involves a reactant gas or a plasma that contains oxygen. A thicker bottom dielectric layer 610 can provide better photoresist protection than a thinner dielectric layer. In some embodiments, bottom dielectric layer 610 can be up to about 6 nm thick to provide adequate photoresist protection against oxygen damage. As mentioned earlier, an oxygen damaged photoresist can suffer from pattern distortion such as, for example, shrinkage, unintentionally large features, line edge roughness, and thickness loss.

The "dielectric stack" approach provides further process flexibility for dielectric layer 620 in terms of reactant gases employed in the deposition process and the dielectric materials deposited. This is because the use of bottom dielectric layer 610 as a protection layer dissociates dielectric layer 620 from acting as the protection layer; therefore, the selection of reactant gases can be extended to include oxygen-based gases. As such, dielectric layer 620 may contain larger concentrations of oxygen compared to bottom dielectric layer 610.

In some embodiments, dielectric layer 610 can be deposited with a low-temperature, PEALD process or a low-temperature, PECVD process similar to dielectric layer 300 of FIG. 3. As mentioned earlier, plasma-enhanced processes have typically lower deposition temperatures when compared to their thermal counterparts because the plasma can provide additional "energy" necessary for the precursor dissociation. A similar thermal process would have to operate at a higher temperature if the same reactants were used.

In some embodiments, the precursor for dielectric layer 610 can be 3DMAS, TDMAT, BTBAS, or BDEAS. In some embodiments, argon plasma, nitrogen plasma, or nitrogen-based plasma (e.g. $NH_3$) can be used during the deposition process to dissociate the aforementioned precursors. In some embodiments, an oxygen plasma or a carbon dioxide plasma can be used during the deposition process to dissociate the precursor if layer 200 is not a photoresist layer or an oxygen-sensitive layer. In some embodiments, the process temperature during deposition can be below 300° C., the process pressure can be between 0.5 and 30 Torr, and the radio frequency (RF) power can range from 5 to 1000 Watts. At higher RF power settings, dielectric layer 610 can become more dense and more etch resistant and can exhibit a lower growth rate. As mentioned earlier, the thickness of dielectric layer 610 can be, for example, up to 6 mm.

In some embodiments, the precursor for dielectric layer 620 can be 3DMAS, TDMAT, BTBAS, or BDEAS. However, the reactant gases used to dissociate the aforementioned precursors can contain oxygen because the underlying dielectric layer 610 has been configured to protect photoresist 200 from oxygen damage. For example, reactant gases that can be used to create a plasma during the deposition of dielectric layer 620 include oxygen, carbon dioxide, and nitrous oxide to name a few. In some embodiments, dielectric layer 620 can be a silicon oxide based material that can contain carbon, nitrogen, titanium, or any combination thereof depending on the precursor used and the process conditions. By way of example and not limitation, dielectric layer 620 can be deposited with a low-temperature, PEALD process or a low-temperature, PECVD process.

Alternatively, dielectric layer 620 can be deposited with a thermal (e.g., non-plasma) ALD or CVD process using the aforementioned oxygen-containing reactant gases (e.g., carbon dioxide and nitrous oxide). In some embodiments, both plasma-enhanced and thermal processes can have deposition temperatures below 300° C. and process pressures in the range of 0.5 to 30 Torr. If the deposition involves plasma, then the RF power can range from about 5 to about 1000 Watts. Similarly to dielectric layers 300 and 610, at higher RF power settings, dielectric layer 620 can become more dense and more etch resistant and can exhibit a lower growth rate.

As mentioned earlier plasma-enhanced processes have typically lower deposition temperatures when compared to their thermal counterparts because the plasma can provide additional "energy" necessary for the precursor dissociation. A similar thermal process would have to operate at a higher temperature if the same reactants are used. For example a thermal process may need to operate at about 300° C. compared to its plasma-enhanced equivalent.

Figure 7:
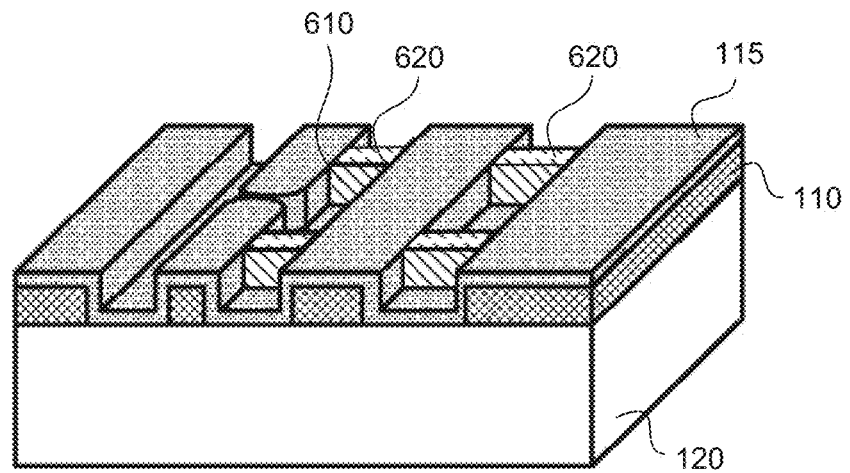
FIG. 7 is an isometric view of a dielectric stack over a spacer material after a first etch-back process according to some embodiments.

In some embodiments, dielectric stack layer 600 and photoresist layer 200, which are above spacer material 115, can be removed with an etch-back process. The etch-back process can use an etch chemistry that exhibits the same selectivity for dielectric layers 610 and 620, as well for photoresist layer 200 and hard mask layer 205. In other words, the dielectric layers and the photoresist layer need to be etched at the same rate during the etch-back process. In some embodiments, the etch-back process has a physical and chemical etch component. By way of example and not limitation, the etch chemistry can include gases such as tetrafluoromethane ($CF_4$) or trifluoromethane ($CHF_3$) and an inert gas like Ar. In some embodiments, the etch rate for dielectric layer 300 can be about 15 Å/sec. However, it can range from 5 to 50 Å/sec depending on the etch-back process conditions and the elemental concentration of dielectric layers 610 and 620. In some embodiments, the etch-back process can stop on spacer material 115 (e.g., when spacer material 115 is exposed by the etch chemistry). Any remaining photoresist on spacer material 115 between patterned structures 110 can be stripped (removed) with a wet clean process or a dry etch process that is selective to photoresist layer 200. FIG. 7 shows patterned structures 110 and spacer material 115 after the completion of an etch-back process and wet clean or dry etch operation according to some embodiments.

Figure 8:
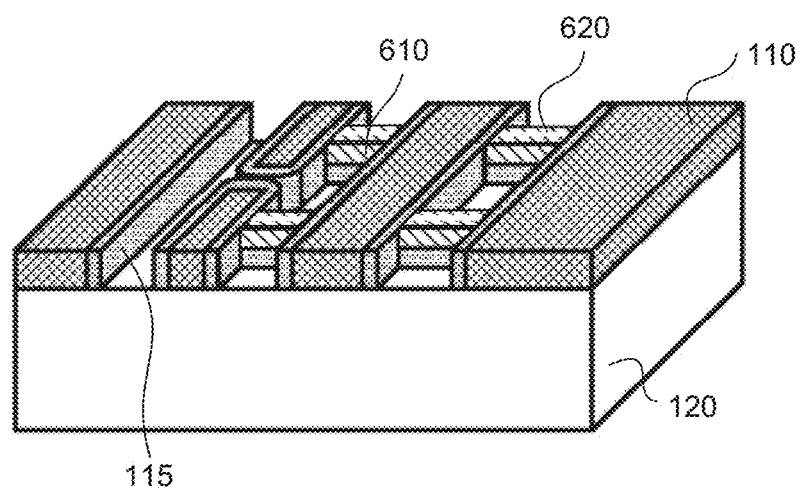
FIG. 8 is an isometric view of a dielectric stack over a spacer material after a second etch-back process according to some embodiments.

In some embodiments, and referring to FIG. 8, a second etch-back process may remove spacer material 115 from horizontal surfaces until a top surface of patterned structures 110 and a top surface of substrate 120 are exposed. In some embodiments, spacer material 115 is not etched on vertical surfaces of patterned structures 100.

Figure 9:
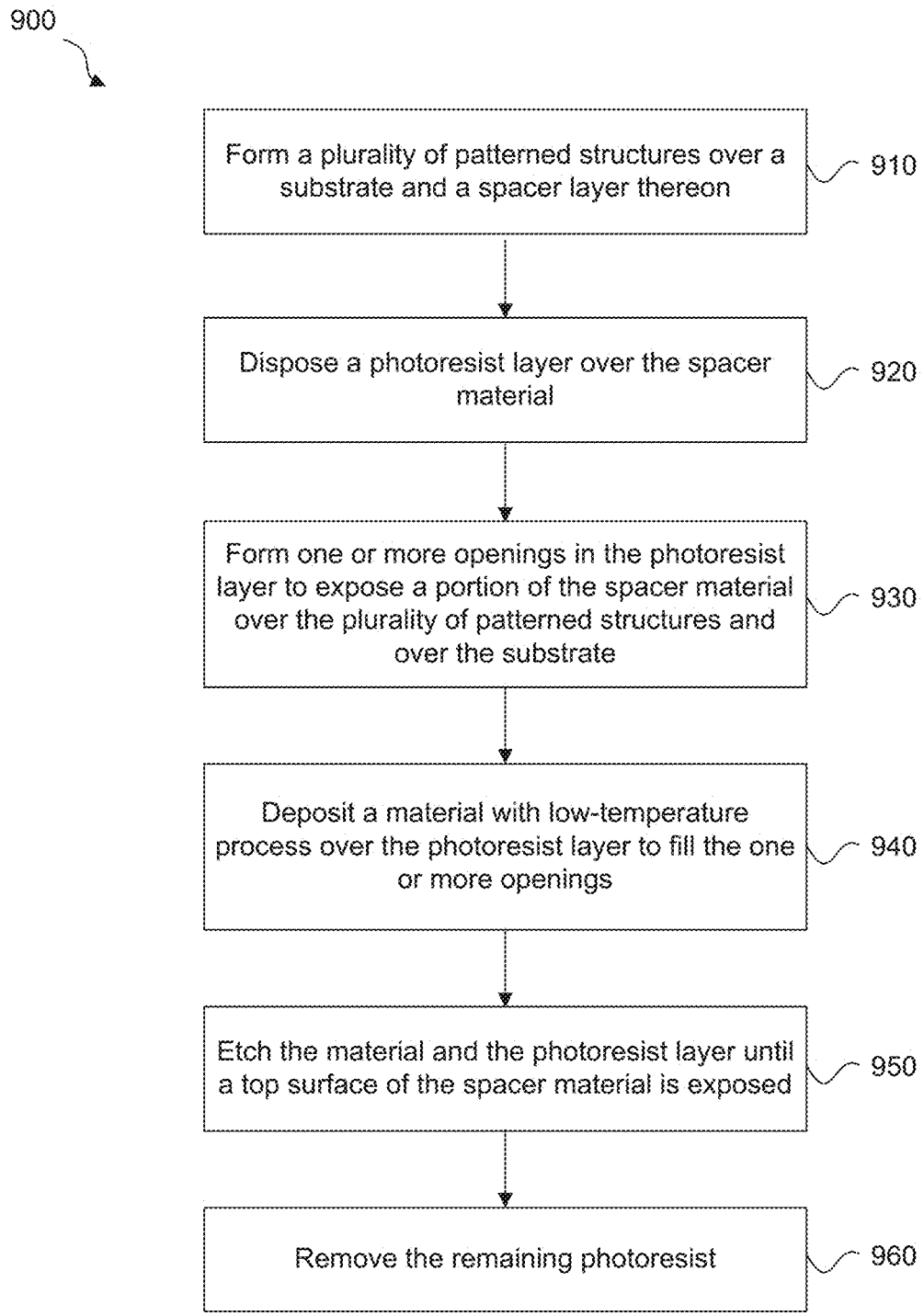
FIG. 9 is a flow chart diagram of an exemplary fabrication process that describes a formation of one or more dielectric layers deposited with a low-temperature process in photoresist structures according to some embodiments.

FIG. 9 is a flow chart diagram of a method of filling a high aspect ratio opening, 900 (thereafter method 900). Method 900 describes the formation of dielectric layers deposited with a low-temperature process in photoresist layer structures. Other fabrication operations may be performed in method 900 and are omitted merely for clarity. The dielectric layer formation may not be limited to exemplary fabrication process 900.

Exemplary fabrication process 900 begins with operation 910 where a plurality of patterned structures can be formed over a substrate. The patterned structure can be made of silicon (e.g., amorphous or crystalline), a dielectric (e.g., nitride, oxide, or carbide), a metal, or any combination thereof. According to some embodiments, the patterned structures have sidewall and top surfaces. In some embodiments, a spacer material can be over the patterned structures. By way of example and not limitation, the spacer material can be made of titanium oxide. The substrate can be a partially fabricated wafer that includes FEOL layers, MOL layers, and a portion of a BEOL interconnect layer where metal vias and lines are formed. In some embodiments, the substrate can be a bare semiconductor wafer, a semiconductor on insulator (SOI) wafer. By way of example and not limitation, the substrate can be made of silicon, another elementary semiconductor, an alloy semiconductor, or a combination of thereof. Alternatively, the substrate can be non-semiconducting, for example quartz. Structure 100 of FIG. 1 is an exemplary structure that results from operation 910 with substrate 120, patterned structures 110, and spacer material 115.

In operation 920, a material layer—e.g., layer 200 of FIG. 2—is disposed over spacer material 115. In some embodiments, layer 200 may be photoresist, a dielectric, metal, or a semiconductor. For example purposes, layer 200 will be described in the context of a photoresist layer. Other material layers with high aspect ratio openings can be used such as, for example, dielectrics, metals, and semiconductors. These other types of material layers are within the spirit and scope of this disclosure. In referring to FIG. 2, photoresist layer 200 can be an organic compound susceptible to damage by a subsequent process that contains oxygen as a reactant gas or in the form of a plasma. In some embodiments, photoresist layer 200 can be covered by a thin hard mask layer 205 with a thickness that can range from 20 to 40 nm. In some embodiments, hard mask layer 205 can contain, for example, silicon, oxygen, and carbon.

In operation 930, at least one opening is formed in the photoresist layer to expose a portion of spacer material 115 over the plurality of patterned structures 110 and substrate 120. In referring to FIG. 2, photoresist layer 200 is patterned and openings 210 can be formed to expose portion of the spacer material 115 over patterned structures 110 and substrate 120. More than two openings similar to openings 210 are possible across photoresist layer 200. For example, different areas of photoresist layer 200 can be patterned by exposing the areas to UV or EUV light according to a photomask pattern. A post exposure bake can be performed to initiate chemical reactions in the photoresist to change the solubility of the exposed areas of the photoresist. For a negative-tone photoresist, exposed areas are crosslinked (hardened) and become non-soluble in a developer solution. For a positive-tone photoresist, the non-exposed areas are crosslinked (hardened) and become non-soluble in a developer solution. Therefore, for a negative tone photoresist, the exposed areas are not removed. And for a positive-tone resist, the exposed areas are removed. Photoresist layer 200 can be either a positive or a negative-tone photoresist according to some embodiments.

After the exposure, the photoresist layer is developed. During the develop step, the photoresist layer is exposed to a developer solution, which dissolves non-crosslinked areas of the photoresist. After exposure to the developer solution, the wafer is rinsed with de-ionized water (DI) and dried. A post-development thermal bake (a hard bake) is done to evaporate any residual solvent and harden the photoresist layer. Nominal hard bake temperatures for positive-tone and negative tone resists can be about 130° C. and 150° C., respectively.

In some embodiments, a plurality of openings similar to opening 210 is possible in different areas of the wafer. In some embodiments, openings similar to opening 210 can have an aspect ratio of about 10:1. This means that an opening can have a depth of about 150 nm and a bottom width of about 15 nm. In some embodiments, openings similar to opening 210 can have an aspect ratio greater than 10:1 (e.g., 20:1). The aspect ratio is defined as the ratio between the opening's depth to width.

In operation 940, a material—e.g., dielectric layer 300 of FIG. 3—is deposited over the photoresist layer to fill at least one opening. The deposition process is conducted at a low-temperature. In referring to FIG. 3, dielectric layer 300 is deposited over photoresist layer 200 and hard mask 205 to fill opening 210. By way of example and not limitation, the thickness of dielectric layer 300 can be up to about 500 nm. In some embodiments, layer 300 can be deposited with a low-temperature, PEALD or a low-temperature, PECVD process. In some embodiments, the process temperature during deposition can be below 300° C., the pressure can range from 0.5 to 30 Torr, and the radio frequency (RF) power can range from about 5 to about 1000 Watts. At higher RF power settings, dielectric layer 300 can become more dense and more etch resistant and can exhibit a lower growth rate. According to some embodiments, the plasma can be either direct or remote depending on the plasma rector configuration.

As discussed above, plasma-enhanced processes have lower deposition temperatures when compared to their thermal counterparts because the plasma can provide additional "energy" necessary for the precursor dissociation. A similar thermal process would have to operate at a higher temperature if the same reactants are used.

Alternatively, a dielectric stack can be deposited in opening 210. For example, referring to FIG. 6, dielectric stack layer 600 can include a bottom dielectric layer 610 and a the top (or gap-fill) layer dielectric 620. In some embodiments, dielectric layer 610 can provide protection against photoresist damage if the deposition of dielectric layer 620 involves a reactant gas or a plasma that contains oxygen. A thicker bottom dielectric layer 610 can provide better photoresist protection than a thinner dielectric layer. In some embodiments, bottom dielectric layer 610 can be up to about 6 nm thick to provide adequate photoresist protection against oxygen damage.

The above "dielectric stack" approach provides further process flexibility for dielectric layer 620 in terms of reactant gases employed in the deposition process and the dielectric materials deposited. As such, dielectric layer 620 may contain oxygen.

In some embodiments, dielectric layer 610 can be deposited with a low-temperature, PEALD process or a low-temperature, PECVD process similar to dielectric layer 300 of FIG. 3. As mentioned earlier, plasma-enhanced processes have typically lower deposition temperatures when compared to their thermal counterparts because the plasma can provide additional "energy" necessary for the precursor dissociation. A similar thermal process would have to operate at a higher temperature if the same reactants were used.

In some embodiments, the precursor for dielectric layer 610 can be 3DMAS, TDMAT, BTBAS, or BDEAS, In some embodiments, argon plasma, nitrogen plasma, or nitrogen-based plasma (e.g. $NH_3$) can be used during the deposition process to dissociate the aforementioned precursors. In some embodiments, an oxygen plasma or a carbon dioxide plasma can be used during the deposition process to dissociate the precursor if layer 200 is not a photoresist layer or an oxygen-sensitive layer. In some embodiments, the process temperature during deposition can be below 300° C., the process pressure can be between 0.5 and 30 Torr, and the radio frequency (RF) power can range from 5 to 1000 Watts. At higher RF power settings, dielectric layer 610 can become more dense and more etch resistant and can exhibit a lower growth rate. As mentioned earlier, the thickness of dielectric layer 610 can be, for example, up to 6 nm.

In some embodiments, the precursor for dielectric layer 620 can be 3DMAS, TDMAT, BTBAS, or BDEAS. However, the reactant gases used to dissociate the aforementioned precursors can contain oxygen because the underlying dielectric layer 610 has been configured to protect photoresist 200 from oxygen damage. For example, reactant gases that can be used to create a plasma during the deposition of dielectric layer 620 include oxygen, carbon dioxide, and nitrous oxide to name a few. In some embodiments, dielectric layer 620 can be a silicon oxide based material that can contain carbon, nitrogen, titanium, or any combination thereof depending on the precursor used and the process conditions. By way of example and not limitation, dielectric layer 620 can be deposited with a low-temperature, PEALD process or a low-temperature, PECVD process.

Alternatively, dielectric layer 620 can be deposited with a thermal (e.g., non-plasma) ALD or CVD process using the aforementioned oxygen-containing reactant gases (e.g., carbon dioxide and nitrous oxide). In some embodiments, both plasma-enhanced and thermal processes can have deposition temperatures below about 300° C. and process pressures in the range of 0.5 to 30 Torr. If the deposition involves plasma, then the RF power can range from about 5 to about 1000 Watts. Similarly to dielectric layers 300 and 610, at higher RF power settings, dielectric layer 620 can become more dense and more etch resistant and can exhibit a lower growth rate.

In operation 950, the materials above the spacer material are etched. Referring to FIG. 3, dielectric layer 300, photoresist layer 200, and hard mask 205 above spacer material 115 are removed. For example, the removal can be accomplished with an etch-back process where dielectric layer 300, photoresist layer 200 and hard mask 205 are removed concurrently. Consequently, the etch-back selectivity should be the same for the materials to be removed. By way of example and not limitation, the etch chemistry can include gases such as $CF_4$ or $CHF_3$ and an inert gas like Ar. In some embodiments, the etch rate for dielectric layer 300 can have a range from about 5 Å/sec to 50 Å/sec (e.g., about 15 Å/sec) depending on the etch-back process conditions. In some embodiments, the etch back process can stop on spacer material 115 (e.g., when spacer material 115 is exposed by the etch chemistry).

In operation 960, any remaining photoresist can be removed. For example, in referring to FIGS. 4 and 7, photoresist 200 over spacer material 115 between patterned structures 110 can be stripped (removed) with a wet clean process or a dry etch process that is selective to photoresist layer 200. In some embodiments, a second etch-back process can remove spacer material 115 over the horizontal surfaces of patterned structures 110 and substrate 120. FIGS. 5 and 8 show patterned structures 110 and spacer material 115 after the completion of an etch-back process and wet clean or dry etch operation according to some embodiments.

The present disclosure is directed to dielectric films or stack of films that can be deposited on a photoresist layer without damaging the photoresist material and that can fill aspect ratio features greater than 10:1. According to some embodiments, such dielectric films or stack of films can be deposited with a conformal, low-temperature (e.g., below 300° C.), plasma-assisted or thermal deposition processes with a process pressure range between 0.5 to 30 Torr. In addition, the dielectric films can be removed with an etch-back process using a mixture of, for example, $CF_4$, $CHF_3$ and inert gases with good etch selectivity and acceptable etch rates ranging from 5 to 50 Å/sec (e.g., about 15 Å/sec) depending on the etch-back process conditions.

According to some embodiments, the dielectric film can include: (i) a thin bottom dielectric layer (e.g., up to 6 nm) deposited directly on the photoresist layer with a conformal, low-temperature (e.g., below 300° C.) plasma-enhanced deposition process with a process pressure range between 0.5 to 30 Torr; and (ii) a thicker top gap-fill dielectric layer (e.g., up to 500 nm) deposited over the first dielectric layer with a low-temperature (e.g., below 300° C.), conformal, plasma-enhanced or thermal deposition process with a process pressure range between 0.5 to 30 Torr.

A "dielectric stack" approach provides further process flexibility for the gap fill dielectric layer in terms of reactant gases employed and the dielectric materials deposited. This is because the use of the bottom dielectric layer as a protection layer dissociates the top gap-fill dielectric layer from this role, and the selection of reactant gases can be extended to include oxygen-based gases. As such, the gap-fill dielectric layer can contain larger concentrations of oxygen compared to the bottom dielectric layer.

In addition, the use of plasma-enhanced processes can be advantageous because it lowers the required deposition temperature in comparison to thermal processes. The plasma can provide additional "energy" necessary for the precursor dissociation. A similar thermal process would have to operate at a higher temperature (e.g., close to or higher than 300° C.) if the same reactants are used. In some embodiments, the dielectric stack can be removed with a suitable etch-back process that has similar etch rates for the dielectric layers and the photoresist layer. By way of example and not limitation, the etch-back chemistry can include gases such as $CF_4$ or $CHF_3$ and an inert gas like Ar. In some embodiments, the etch rate for dielectric layers can have range from 5 to 50 Å/sec (e.g., 15 Å/sec) depending on the etch-back process conditions.

In some embodiments, a method includes a plurality of patterned structures formed over a substrate and a spacer material formed over the plurality of patterned structures. A material layer disposed over the spacer material with one or more openings formed in the material layer to expose a portion of the spacer material. A dielectric is deposited over the material layer to fill the one or more openings. Further, the dielectric and the material layer are etched until the spacer material is exposed.

In some embodiments, a method includes a plurality of patterned structures formed over a substrate, where each of the plurality of patterned structures has a top surface. A spacer material is formed over the patterned structures and a photoresist layer is disposed over the spacer material. An opening is formed in the photoresist layer to expose a portion of the spacer material, and a material stack is deposited in the opening. The material stack includes a bottom layer and a top layer, where depositing the material stack includes depositing the bottom layer conformally on the photoresist layer; and depositing the top layer to fill the opening. The material stack and the photoresist layer are etched until the spacer material is exposed. Further, the spacer material is removed over the top surface of the plurality of patterned structures and over the substrate.

In some embodiments, a method includes a plurality of patterned structures formed over a substrate, and a spacer material formed over the plurality of patterned structures. A first material stack is disposed over the spacer material, where the first material stack includes a photoresist bottom layer, which is covering the spacer material, and a hard mask top layer. An opening is formed with an aspect ratio greater than 10 to 1 in the first material stack to expose a portion of the spacer material. A second material stack is deposited over the first material stack to fill the opening. The second material stack includes a second bottom layer, which is formed on the photoresist bottom layer and the hard mask top layer, and a second top layer that fills the opening.

The foregoing outlines features of embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a plurality of patterned structures over a substrate;
    forming a spacer material over the plurality of patterned structures;
    disposing a photoresist layer over the spacer material;
    forming one or more openings in the photoresist layer to expose a portion of the spacer material;
    depositing a material stack comprising a bottom layer and a top layer over the photoresist layer to fill the one or more openings, wherein the depositing the material stack comprises:
        depositing the bottom layer conformally on the photoresist layer with an oxygen-free process, and
        depositing the top layer to fill the one or more openings; and
    etching the material stack and the photoresist layer until the spacer material is exposed.

2. The method of claim 1, further comprising:
    removing the spacer material over a top surface of the plurality of patterned structures.

3. The method of claim 1, wherein the depositing the material stack comprises depositing the material stack with a plasma-enhanced chemical vapor deposition (PECVD) or a plasma-enhanced atomic layer deposition (PEALD) process.

4. The method of claim 3, wherein the PECVD or PEALD process uses a tris(dimethylamino)silane (3DMAS), a tetrakis(dimethylamino)titanium (TDMAT), a bis(tertiary-butyl-amino)silane (BTBAS), or a bis(diethylamino)silane (BDEAS) precursor and an argon, a nitrogen, or a nitrogen-based plasma.

5. The method of claim 3, wherein the PECVD or PEALD process comprises a processing temperature below 300° C.

6. The method of claim 1, wherein the one or more openings have an aspect ratio greater than 10 to 1.

7. A method comprising:
    forming a plurality of patterned structures over a substrate, wherein each of the plurality of patterned structures has a top surface;

forming a spacer material over the plurality of patterned structures;

disposing a photoresist layer over the spacer material;

forming an opening in the photoresist layer to expose a portion of the spacer material;

depositing a material stack in the opening, the material stack comprising a bottom layer and a top layer, wherein the depositing the material stack comprises:

depositing the bottom layer conformally on the photoresist layer; and depositing the top layer to fill the opening;

etching the material stack and the photoresist layer until the spacer material is exposed; and removing the spacer material over the top surface of the plurality of patterned structures and over the substrate.

8. The method of claim 7, wherein the depositing the bottom layer comprises depositing the bottom layer with a tris(dimethylamino)silane (3DMAS), a tetrakis(dimethylamino)titanium (TDMAT), a bis(tertiary-butyl-amino)silane (BTBAS), or a bis(diethylamino)silane (BDEAS) precursor and with an argon, a nitrogen, or a nitrogen-based plasma.

9. The method of claim 7, wherein the depositing the top layer comprises depositing the top layer with a tris(dimethylamino)silane (3DMAS), a tetrakis(dimethylamino)titanium (TDMAT), a bis(tertiary-butyl-amino)silane (BTBAS), or a bis(diethylamino)silane (BDEAS) precursor and with an oxygen, a carbon dioxide, or a nitrous oxide reactant gas or plasma.

10. The method of claim 7, wherein the depositing the bottom and top layers comprises depositing the bottom and top layers with a plasma-enhanced chemical vapor deposition (PECVD) process or a plasma-enhanced atomic layer deposition (PEALD) process.

11. The method of claim 7, wherein the depositing the top layer comprises depositing the top layer with a thermal chemical vapor deposition (CVD) process or a thermal atomic layer deposition (ALD) process.

12. The method of claim 7, wherein the depositing the bottom and top layers comprises depositing the bottom and top layers at a temperature below 300° C.

13. A method comprising:

forming a plurality of patterned structures over a substrate;

forming a spacer material over the plurality of patterned structures;

disposing a first material stack over the spacer material, wherein the first material stack comprises a photoresist bottom layer and a hard mask top layer; the photoresist bottom layer covering the spacer material;

forming an opening with an aspect ratio greater than 0.0 to 1 in the first material stack to expose a portion of the spacer material; and depositing a second material stack over the first material stack to fill the opening, the second material stack comprising a second bottom layer and a second top layer, wherein the second bottom layer is formed on the photoresist bottom layer and the hard mask top layer, and wherein the second top layer fills the opening.

14. The method of claim 13, further comprising:

concurrently removing the first material stack and the second material stack until the spacer material is exposed; and removing the spacer material over a top surface of the plurality of patterned structures and over the substrate.

15. The method of claim 13, wherein the depositing the second material stack comprises depositing the second bottom layer with a tris(dimethylamino)silane (3DMAS), a tetrakis(dimethylamino)titanium (TDMAT), a bis(tertiary-butyl-amino)silane (BTBAS), or a bis(diethylamino)silane (BDEAS) precursor and with an argon, a nitrogen, or a nitrogen-based plasma.

16. The method of claim 13, wherein the depositing the second material stack comprises depositing the second top layer with a tris(dimethylamino)silane (3DMAS), a tetrakis(dimethylamino)titanium (TDMAT), a bis(tertiary-butyl-amino)silane (BTBAS), or a bis(diethylamino)silane (BDEAS) precursor and with an oxygen, a carbon dioxide, or a nitrous oxide reactant gas or plasma.

17. The method of claim 13, wherein the depositing the second material stack comprises depositing the second bottom layer with a plasma-enhanced chemical vapor process (PECVD) or a plasma-enhanced atomic layer deposition (PEALD) process.

18. The method of claim 17, wherein the PECVD or PEALD process comprises a deposition temperature below 300° C.

19. The method of claim 13, wherein the depositing the second material stack comprises depositing the second top layer with a thermal chemical vapor deposition (CND) process or atomic layer deposition (ALD) process.

20. The method of claim 13, wherein the depositing the second material stack comprises depositing the second top layer with a plasma-enhanced chemical vapor deposition (PECVD) process or a plasma-enhanced atomic layer deposition (PEALD) process, wherein the PECVD or PEALD process comprises a deposition temperature below 300° C.

* * * * *